(12) United States Patent
Hyland et al.

(10) Patent No.: US 7,811,747 B2
(45) Date of Patent: *Oct. 12, 2010

(54) METHOD OF PATTERNING AN ANTI-REFLECTIVE COATING BY PARTIAL DEVELOPING

(75) Inventors: Sandra L. Hyland, Guilderland, NY (US); Shannon W. Dunn, Altamont, NY (US)

(73) Assignee: Tokyo Electron Limited, Tokyo (JP)

( * ) Notice: Subject to any disclaimer, the term of this patent is extended or adjusted under 35 U.S.C. 154(b) by 450 days.

This patent is subject to a terminal disclaimer.

(21) Appl. No.: 11/534,477

(22) Filed: Sep. 22, 2006

(65) Prior Publication Data

US 2008/0076069 A1    Mar. 27, 2008

(51) Int. Cl.
G03F 7/20    (2006.01)

(52) U.S. Cl. ............... 430/323; 430/311; 430/313; 430/396; 430/322

(58) Field of Classification Search .............. None
See application file for complete search history.

(56) References Cited

U.S. PATENT DOCUMENTS

| | | | | |
|---|---|---|---|---|
| 5,753,417 | A * | 5/1998 | Ulrich | 430/312 |
| 7,432,191 | B1 | 10/2008 | Stamper et al. | |
| 2002/0081531 | A1 | 6/2002 | Jain | |
| 2003/0129531 | A1 | 7/2003 | Oberlander et al. | |
| 2003/0205658 | A1 | 11/2003 | Voisin | |
| 2005/0074699 | A1 | 4/2005 | Sun et al. | |
| 2005/0116231 | A1 | 6/2005 | Kang et al. | |
| 2005/0153538 | A1 | 7/2005 | Tsai et al. | |
| 2005/0167394 | A1 | 8/2005 | liu et al. | |
| 2006/0003268 | A1 * | 1/2006 | Hong et al. | 430/323 |
| 2006/0177772 | A1 | 8/2006 | Abdallah et al. | |
| 2006/0222968 | A1 | 10/2006 | Talin et al. | |
| 2006/0223245 | A9 | 10/2006 | Pellens et al. | |
| 2006/0290012 | A1 | 12/2006 | Sadjadi | |
| 2007/0077523 | A1 | 4/2007 | Finders | |
| 2007/0148598 | A1 * | 6/2007 | Colburn et al. | 430/311 |
| 2007/0166648 | A1 | 7/2007 | Ponoth et al. | |
| 2008/0020327 | A1 | 1/2008 | Yang et al. | |
| 2008/0076075 | A1 * | 3/2008 | Hyland et al. | 430/312 |

OTHER PUBLICATIONS

U.S. Patent and Trademark Office, Non-final Office Action received in related U.S. Appl. No. 11/534,261 dated Jun. 23, 2008, 14 pp.
U.S. Patent and Trademark Office, Non-final Office Action received in related U.S. Appl. No. 11/534,365 dated Jun. 24, 2008, 14 pp.
European Patent Office, International Search Report and Written Opinion received in related PCT Application No. PCT/US2007/077166 dated Dec. 20, 2007, 13 pp.
U.S. Patent and Trademark Office, Non-final Office Action received in related U.S. Appl. No. 11/623,247 dated Oct. 9, 2008, 14 pp.
U.S. Patent and Trademark Office, Final Office Action received in related U.S. Appl. No. 11/534,365 dated Mar. 19, 2009, 16 pp.
State Intellectual Property Office of the People's Republic of China, First Office Action received in related Chinese Patent Application No. 200710151302.9 dated Jan. 16, 2009, 7 pp.
U.S. Patent and Trademark Office, Non-final Office Action received in related U.S. Appl. No. 11/534,261 dated Jan. 15, 2009, 12 pp.
U.S. Patent and Trademark Office, Non-final Office Action received in related U.S. Appl. No. 11/534,420 dated Dec. 23, 2008, 23 pp.
U.S. Patent and Trademark Office, Non-final Office Action received in related U.S. Appl. No. 11/623,237 dated Sep. 15, 2009, 16 pp.
U.S. Patent and Trademark Office, Non-final Office Action received in related U.S. Appl. No. 11/534,365 dated Sep. 4, 2009, 15 pp.
U.S. Patent and Trademark Office, Final Office Action received in related U.S. Appl. No. 11/534,261 dated Aug. 28, 2009, 12 pp.
U.S. Patent and Trademark Office, Non-final Office Action received in related U.S. Appl. No. 11/534,538 dated Jul. 13, 2009, 16 pp.
U.S. Patent and Trademark Office, Non-final Office Action received in related U.S. Appl. No. 11/623,247 dated Jun. 2, 2009, 17 pp.

(Continued)

*Primary Examiner*—Daborah Chacko Davis
(74) *Attorney, Agent, or Firm*—Wood, Herron & Evans, LLP

(57) ABSTRACT

A method of patterning a thin film is described. The method comprises forming a thin film to be patterned on a substrate, forming a developable anti-reflective coating (ARC) layer on the thin film, and forming a mask layer on the developable ARC layer. Thereafter, the mask layer is patterned to form a pattern therein, and the pattern is partially transferred to the developable ARC layer using an imaging and developing process. Once the mask layer is removed, the pattern is completely transferred to the developable ARC layer using an etching process, and the pattern in the developable ARC layer is transferred to the underlying thin film using another etching process.

16 Claims, 11 Drawing Sheets

OTHER PUBLICATIONS

U.S. Patent and Trademark Office, Final Office Action received in related U.S. Appl. No. 11/623,247 dated Dec. 18, 2009, 18 pp.
U.S. Patent and Trademark Office, Advisory Action received in related U.S. Appl. No. 11/534,261 dated Dec. 2, 2009, 6 pp.
U.S. Patent and Trademark Office, Final Office Action received in related U.S. Appl. No. 11/534,538 dated Jan. 26, 2010, 12 pp.
U.S. Patent and Trademark Office, Non-final Office Action received in related U.S. Appl. No. 11/534,538 dated Apr. 12, 2010, 15 pp.

* cited by examiner

METHOD OF PATTERNING AN ANTI-REFLECTIVE COATING BY PARTIAL DEVELOPING

CROSS-REFERENCE TO RELATED APPLICATIONS

This application is related to co-pending U.S. patent application Ser. No. 11/534,261, entitled "METHOD FOR DOUBLE IMAGING A DEVELOPABLE ANTI-REFLECTIVE COATING", filed on even date herewith; co-pending U.S. patent application Ser. No. 11/534,365, entitled "METHOD FOR DOUBLE PATTERNING A DEVELOPABLE ANTI-REFLECTIVE COATING", filed on even date herewith; co-pending U.S. patent application Ser. No. 11/534,420, entitled "METHOD OF PATTERNING A DEVELOPABLE ANTI-REFLECTIVE COATING BY PARTIAL ETCHING", filed on even date herewith; and co-pending U.S. patent application Ser. No. 11/534,538, entitled "METHOD FOR DOUBLE PATTERNING A THIN FILM", filed on even date herewith. The entire contents of these applications are herein incorporated by reference in their entirety.

BACKGROUND OF THE INVENTION

1. Field of the Invention

The present invention relates to a method for patterning a thin film on a substrate, and more particularly to a method for patterning a thin film on a substrate using a partially developed anti-reflective coating (ARC) layer.

2. Description of Related Art

In material processing methodologies, pattern etching comprises the application of a thin layer of light-sensitive material, such as photo-resist, to an upper surface of a substrate that is subsequently patterned in order to provide a mask for transferring this pattern to the underlying thin film on a substrate during etching. The patterning of the light-sensitive material generally involves exposure by a radiation source through a reticle (and associated optics) of the light-sensitive material using, for example, a photo-lithography system, followed by the removal of the irradiated regions of the light-sensitive material (as in the case of positive photo-resist), or non-irradiated regions (as in the case of negative resist) using a developing solvent. Moreover, this mask layer may comprise multiple sub-layers.

Once the pattern is transferred to the underlying thin film, it is essential to remove the mask layer while not damaging the material properties of the underlying thin film. For example, the thin film may comprise a low dielectric constant (low-k, or ultra-low-k) dielectric film that may be used in back-end-of-line (BEOL) metallization schemes for electronic devices. Such materials, which may include non-porous low-k dielectrics as well as porous low-k dielectrics, are susceptible to damage, e.g., degradation of dielectric constant, water absorption, residue formation, etc., when exposed to the chemistries necessary for removal of the mask layer and its sub-layers. Therefore, it is important to establish pattern transfer schemes that reduce the potential for damaging the underlying thin film when forming such a pattern and removing the necessary mask layer(s).

SUMMARY OF THE INVENTION

The present invention relates to a method for patterning a thin film on a substrate.

According to one embodiment, a method of patterning a thin film using an anti-reflective coating (ARC) layer is described. A pattern, formed in a mask layer overlying the ARC layer, is partially transferred to the ARC layer, and then the mask layer is removed. Thereafter, the pattern is completely transferred to the ARC layer using an etching process.

According to another embodiment, a method of patterning a thin film on a substrate, and a computer readable medium for patterning, are described, comprising: preparing a film stack on the substrate, the film stack comprising the thin film formed on the substrate, a developable anti-reflective coating (ARC) layer formed on the thin film, and a layer of photo-resist formed on the developable ARC layer; imaging the layer of photo-resist with a pattern using a photo-lithography system; partially imaging the developable ARC layer with the pattern such that the imaging is to a depth less than the thickness of the ARC layer using the photo-lithography system; developing the layer of photo-resist to form the pattern in the layer of photo-resist; developing the developable ARC layer to partially form the pattern extending to the depth; removing the layer of photo-resist following the developing of the layer of photo-resist and the developing of the developable ARC layer; transferring the pattern in the developable ARC layer substantially through the developable ARC layer by etching the developable ARC layer; and transferring the pattern to the thin film while substantially consuming the developable ARC layer.

DETAILED DESCRIPTION OF EXEMPLARY EMBODIMENTS

In the following description, for purposes of explanation and not limitation, specific details are set forth, such as particular processes and patterning systems. However, it should be understood that the invention may be practiced in other embodiments that depart from these specific details.

Figure 1A:
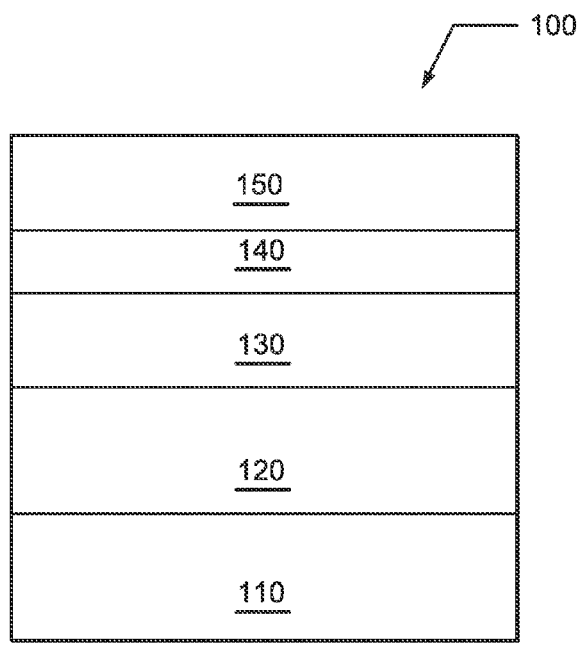
FIGS. 1A through 1J illustrate schematically a known method for patterning a thin film on a substrate.

Referring now to the drawings wherein like reference numerals designate identical or corresponding parts throughout the several views, FIGS. 1A through 1J schematically illustrate a method of patterning a substrate according to the prior art. As illustrated in FIG. 1A, a lithographic structure 100 comprises a film stack formed on substrate 110. The film stack comprises a thin film 120, such as a dielectric layer, formed on substrate 110, an organic planarization layer (OPL) 130 formed on the thin film 120, an anti-reflective coating (ARC) layer 140 formed on the OPL 130, and a layer of photo-resist 150 formed on the ARC layer 140.

Figure 1B:
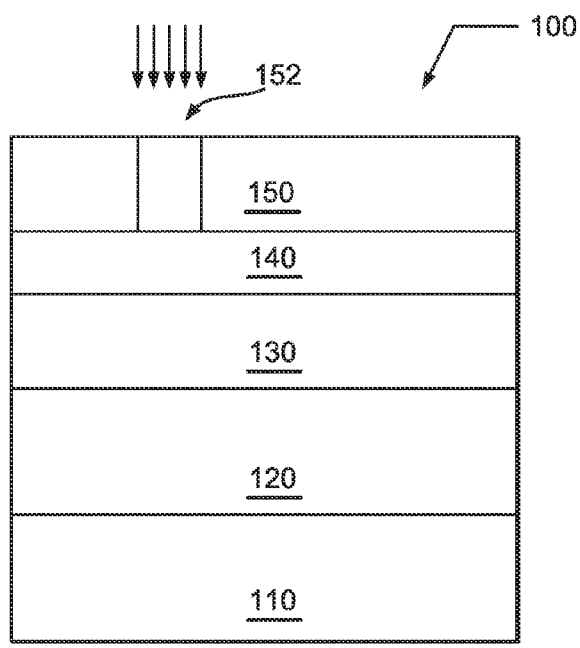
Figure 1C:
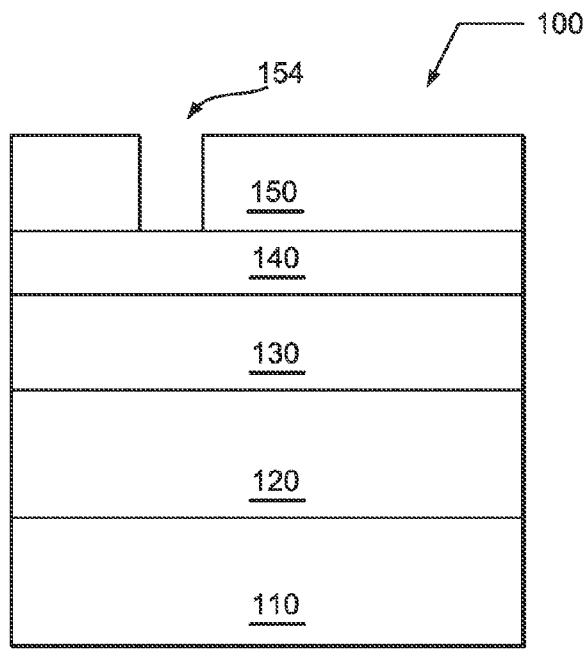
Figure 1D:
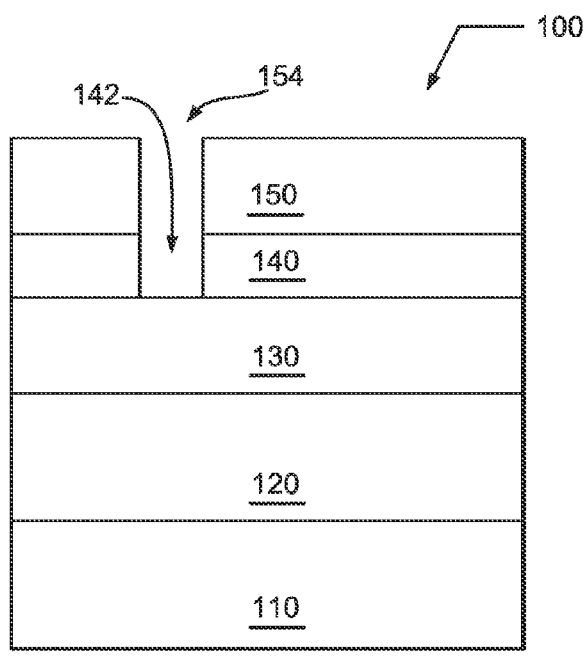

As shown in FIG. 1B, the photo-resist layer 150 is exposed to a first image pattern 152 using a photo-lithography system, and thereafter in FIG. 1C, the first image pattern 152 is developed in a developing solvent to form a first pattern 154 in the photo-resist layer 150. The first pattern 154 in the photo-resist layer 150 is transferred to the underlying ARC layer 140 using a dry etching process to form a first ARC pattern 142 as shown in FIG. 1D.

Figure 1E:
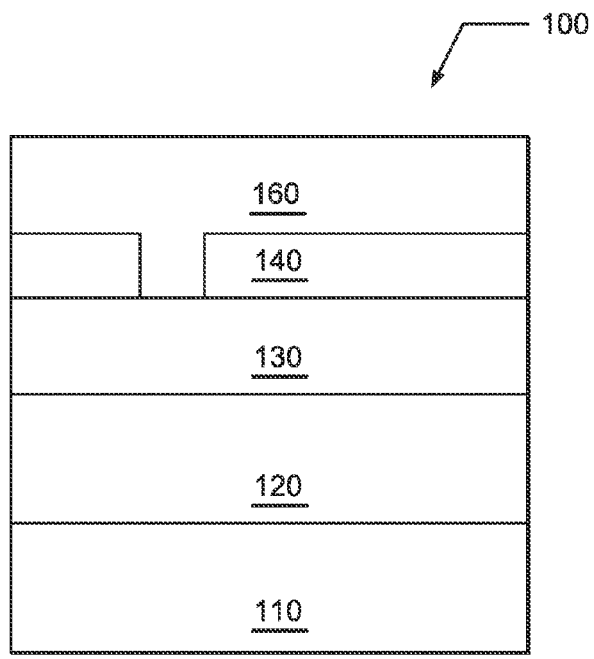
Figure 1F:
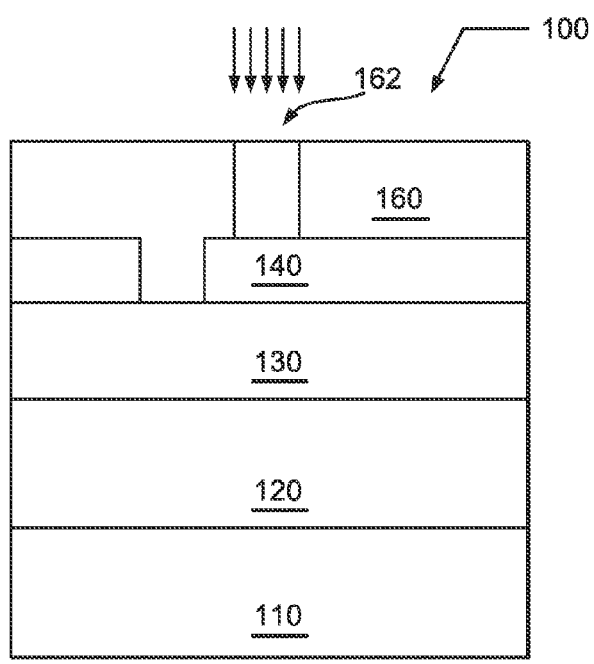
Figure 1G:
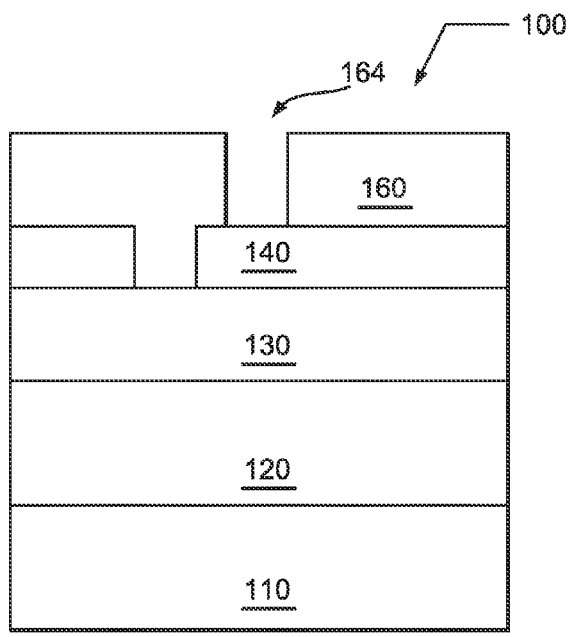
Figure 1H:
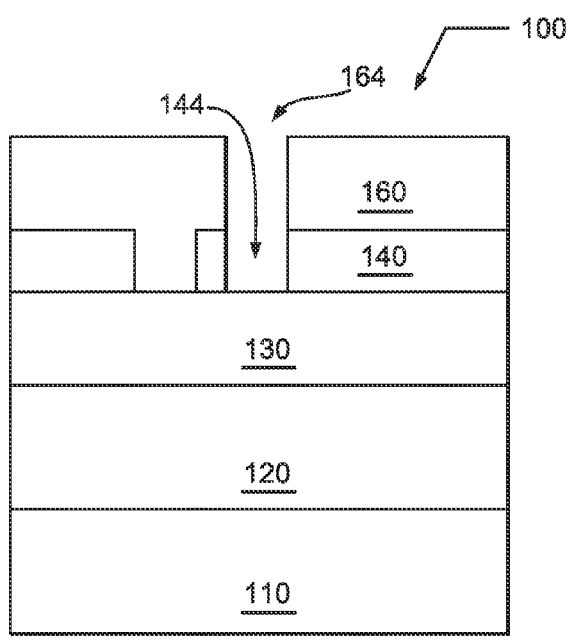

Now, as shown in FIG. 1E, photo-resist layer 150 is removed, and a second photo-resist layer 160 is applied to the ARC layer 140. The second photo-resist layer 160 is exposed to a second image pattern 162, as shown in FIG. 1F, using a photo-lithography system, and thereafter in FIG. 1G, the second image pattern 162 is developed in a developing solvent to form a second pattern 164 in the second photo-resist layer 160. The second pattern 164 in the second photo-resist layer 160 is transferred to the underlying ARC layer 140 using an etching process to form a second ARC pattern 144 as shown in FIG. 1H.

Figure 1I:
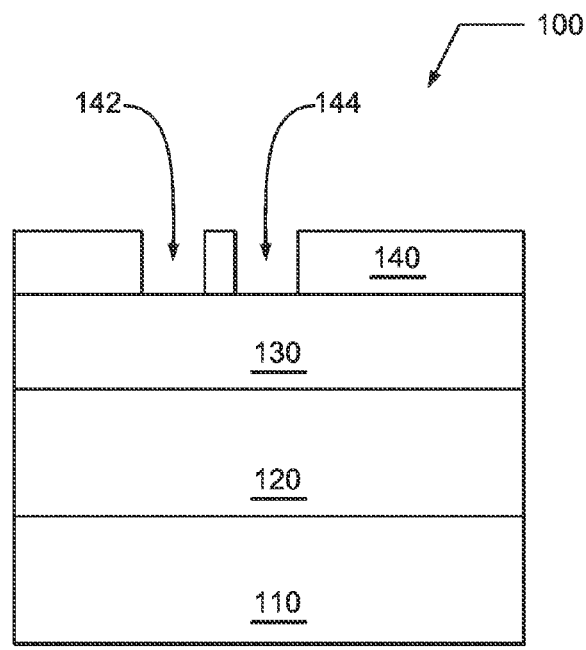
Figure 1J:
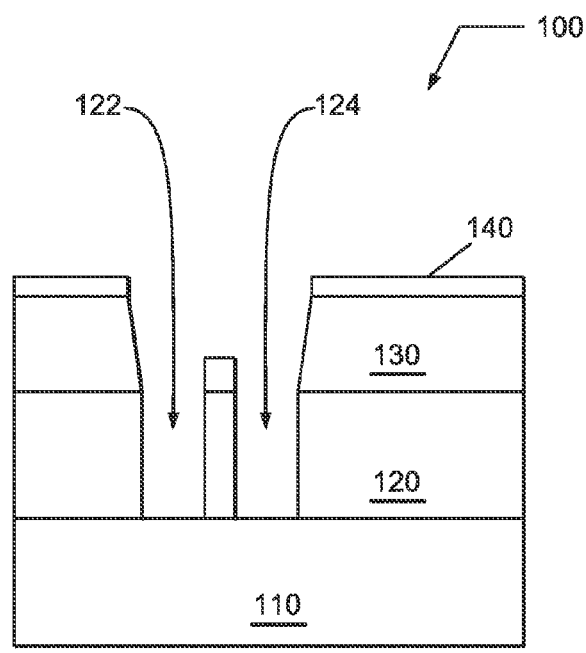

As illustrated in FIGS. 1I and 1J, respectively, the second layer of photo-resist 160 is removed, and the first and second ARC patterns 142 and 144 are transferred to the underlying OPL 130 and the thin film 120 to form a first feature pattern 122 and a second feature pattern 124 using one or more etching processes. However, as shown in FIG. 1J, once the pattern transfer to thin film 120 is complete, the ARC layer 140 is only partially consumed, thus leaving material, in addition to the remaining OPL, to be removed. The inventors have observed that the process, such as a flash etch, required to remove the remaining ARC layer is detrimental to the material properties of the underlying thin film 120.

For example, the thin film 120 may comprise a low dielectric constant (low-k, or ultra-low-k) dielectric film that may be used in back-end-of-line (BEOL) metallization schemes for electronic devices. Such materials, which may include non-porous low-k dielectrics as well as porous low-k dielectrics, are susceptible to damage, e.g., degradation of dielectric constant, water absorption, residue formation, etc., when exposed to the chemistries necessary for removal of the ARC layer 140.

One option is to reduce the thickness of the ARC layer 140, such that it is substantially consumed during the transfer of the pattern to the thin film 120. However, the thickness of the ARC layer 140 is dictated by the requirements set forth for providing anti-reflective properties during the patterning of the layer of photo-resist. For instance, when the ARC layer is configured to cause destructive interference between incident electro-magnetic (EM) radiation and reflected EM radiation, the thickness ($\tau$) of the ARC layer 140 should be chosen to be a quarter wavelength (i.e., $\tau \sim \lambda/4$, $3\lambda/4$, $5\lambda/4$, etc.) of the incident EM radiation during the imaging of the layer of photo-resist. Alternatively, for instance, when the ARC layer is configured to absorb the incident EM radiation, the thickness ($\tau$) of the ARC layer 140 should be chosen to be sufficiently thick to permit absorption of the incident EM radiation. In either case, the inventors have observed for current geometries that the minimum thickness required to provide anti-reflective properties still leads to an only partially consumed ARC layer following the transfer of the pattern to the underlying thin film.

Therefore, according to an embodiment of the invention, a method of patterning a substrate is illustrated in FIGS. 2A through 2J, and FIG. 3. The method is illustrated in a flow chart 500, and begins in 510 with forming a lithographic structure 200 comprising a film stack formed on substrate 210. The film stack comprises a thin film 220 formed on substrate 210, an optional organic planarization layer (OPL) 230 formed on the thin film 220, a developable anti-reflective coating (ARC) layer 240 formed on the optional OPL 230 (or on the thin film 220 if there is no OPL 230), and a layer of photo-resist 250 formed on the developable ARC layer 240. Although the film stack is shown to be formed directly upon substrate 210, there may exist additional layers between the film stack and the substrate 210. For example, in a semiconductor device, the film stack may facilitate the formation of one interconnect level, and this interconnect level may be formed upon another interconnect level on substrate 210. Additionally, the thin film 220 may include a single material layer, or a plurality of material layers. For example, the thin film 220 may comprise a bulk material layer having a capping layer.

The thin film 220 may comprise a conductive layer, a non-conductive layer, or a semi-conductive layer. For instance, the thin film 220 may include a material layer comprising a metal, metal oxide, metal nitride, metal oxynitride, metal silicate, metal silicide, silicon, poly-crystalline silicon (poly-silicon), doped silicon, silicon dioxide, silicon nitride, silicon carbide, silicon oxynitride, etc. Additionally, for instance, the thin film 220 may comprise a low dielectric constant (i.e., low-k) or ultra-low dielectric constant (i.e., ultra-low-k) dielectric layer having a nominal dielectric constant value less than the dielectric constant of $SiO_2$, which is approximately 4 (e.g., the dielectric constant for thermal silicon dioxide can range from 3.8 to 3.9). More specifically, the thin film 220 may have a dielectric constant of 3.7 or less, such as a dielectric constant ranging from 1.6 to 3.7.

These dielectric layers may include at least one of an organic, inorganic, or inorganic-organic hybrid material. Additionally, these dielectric layers may be porous or non-porous. For example, these dielectric layers may include an inorganic, silicate-based material, such as carbon doped silicon oxide (or organo siloxane), deposited using CVD techniques. Examples of such films include Black Diamond® CVD organosilicate glass (OSG) films commercially available from Applied Materials, Inc., or Coral® CVD films commercially available from Novellus Systems, Inc. Alternatively, these dielectric layers may include porous inorganic-organic hybrid films comprised of a single-phase, such as a silicon oxide-based matrix having $CH_3$ bonds that hinder full densification of the film during a curing or deposition process to create small voids (or pores). Still alternatively, these dielectric layers may include porous inorganic-organic hybrid films comprised of at least two phases, such as a carbon-doped silicon oxide-based matrix having pores of organic material (e.g., porogen) that is decomposed and evaporated during a curing process. Still alternatively, these dielectric layers may include an inorganic, silicate-based material, such as hydrogen silsesquioxane (HSQ) or methyl silsesquioxane (MSQ), deposited using SOD (spin-on dielectric) techniques. Examples of such films include FOx® HSQ commercially available from Dow Corning, XLK porous HSQ commercially available from Dow Corning, and JSR LKD-5109 commercially available from JSR Microelectronics. Still alternatively, these dielectric layers can comprise an organic material deposited using SOD techniques. Examples of such films include SiLK-I, SiLK-J, SiLK-H, SiLK-D, and porous SiLK® semiconductor dielectric resins commercially available from Dow Chemical, and GX-3™, and GX-3P™ semiconductor dielectric resins commercially available from Honeywell.

The thin film 220 can be formed using a vapor deposition technique, such as chemical vapor deposition (CVD), plasma enhanced CVD (PECVD), atomic layer deposition (ALD), plasma enhanced ALD (PEALD), physical vapor deposition (PVD), or ionized PVD (iPVD), or a spin-on technique, such as those offered in the Clean Track ACT 8 SOD (spin-on dielectric), ACT 12 SOD, and Lithius coating systems commercially available from Tokyo Electron Limited (TEL). The Clean Track ACT 8 (200 mm), ACT 12 (300 mm), and Lithius (300 mm) coating systems provide coat, bake, and cure tools for SOD materials. The track system can be configured for processing substrate sizes of 100 mm, 200 mm, 300 mm, and greater. Other systems and methods for forming a thin film on a substrate are well known to those skilled in the art of both spin-on technology and vapor deposition technology.

The optional OPL 230 can include a photo-sensitive organic polymer or an etch type organic compound. For instance, the photo-sensitive organic polymer may be polyacrylate resin, epoxy resin, phenol resin, polyamide resin, polyimide resin, unsaturated polyester resin, polyphenylenether resin, polyphenylenesulfide resin, or benzocyclobutene (BCB). These materials may be formed using spin-on techniques.

The developable ARC layer 240 possesses material properties suitable for use as an anti-reflective coating. Additionally, the developable ARC layer 240 comprises a light-sensitive material that, when exposed to electro-magnetic (EM) radiation, is chemically altered and thus configured to be removed using a developing solvent. For example, the developable ARC layer 240 may comprise (wet) developable anti-reflective coatings commercially available from Brewer Science. Inc. (2401 Brewer Drive, Rolla, Mo. 65401). Additionally, the developable ARC layer 240 is selected to be compatible with the overlying photo-resist layer 250 and the lithographic wavelength, i.e., ArF, KrF, etc.

The photo-resist layer 250 may comprise 248 nm (nanometer) resists, 193 nm resists, 157 nm resists, or EUV (extreme ultraviolet) resists. The photo-resist layer 250 can be formed using a track system. For example, the track system can comprise a Clean Track ACT 8, ACT 12, or Lithius resist coating and developing system commercially available from Tokyo Electron Limited (TEL). Other systems and methods for forming a photo-resist film on a substrate are well known to those skilled in the art of spin-on resist technology.

Figure 2A:
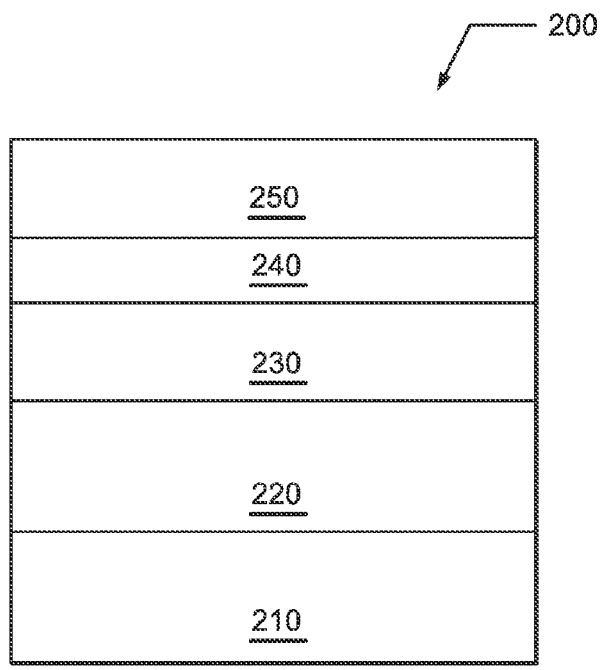
FIGS. 2A through 2J illustrate schematically a method for patterning a thin film on a substrate according to an embodiment of the invention.
Figure 2B:
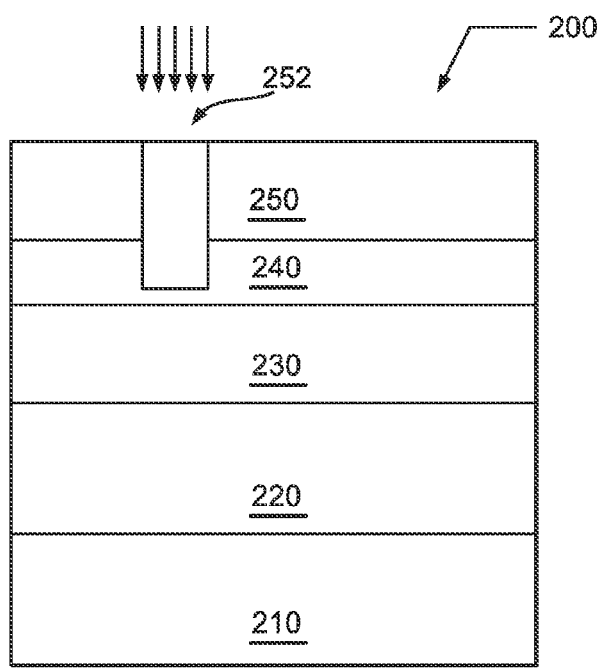

In 520 and as shown in FIG. 2B, the photo-resist layer 250 is imaged with a first image pattern 252. The exposure to EM radiation through a reticle is performed in a dry or wet photo-lithography system. The image pattern can be formed using any suitable conventional stepping lithographic system, or scanning lithographic system. For example, the photo-lithographic system may be commercially available from ASML Netherlands B.V. (De Run 6501, 5504 DR Veldhoven, The Netherlands), or Canon USA, Inc., Semiconductor Equipment Division (3300 North First Street, San Jose, Calif. 95134).

In 530 and as shown in FIG. 2B, the developable ARC layer 240 is partially imaged with the first image pattern 252. The first image pattern 252 extends to a depth less than the thickness of the developable ARC layer 240. The partial imaging of the first image pattern 252 in the developable ARC layer 240 comprises setting at least one of an exposure dose, or an exposure depth of focus, or both in a photo-lithography system to achieve the partial image to said depth. The exposure to EM radiation through a reticle is performed in a dry or wet photo-lithography system. Furthermore, the imaging of the photo-resist layer 250 in 520 and the partial imaging of the developable ARC layer 240 in 530 may be performed at the same time or at separate times.

Figure 2C:
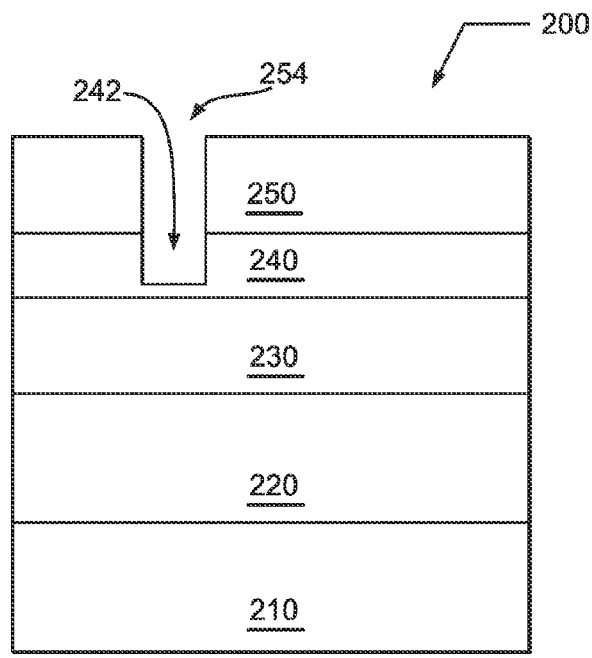

In 540 and as shown in FIG. 2C, the exposed photo-resist layer 250 is subjected to a developing process to form a first mask pattern 254 in the photo-resist layer 250. The developing process can include exposing the substrate to a developing solvent in a developing system, such as a track system. For example, the track system can comprise a Clean Track ACT 8, ACT 12, or Lithius resist coating and developing system commercially available from Tokyo Electron Limited (TEL).

In 550 and as shown in FIG. 2C, the exposed developable ARC layer 240 is subjected to a developing process to form a first ARC pattern 242 in the developable ARC layer 240. The developing of the photo-resist layer 250 in 540 and the developing of the developable ARC layer 240 in 550 may be performed at the same time or at separate times.

Figure 2D:
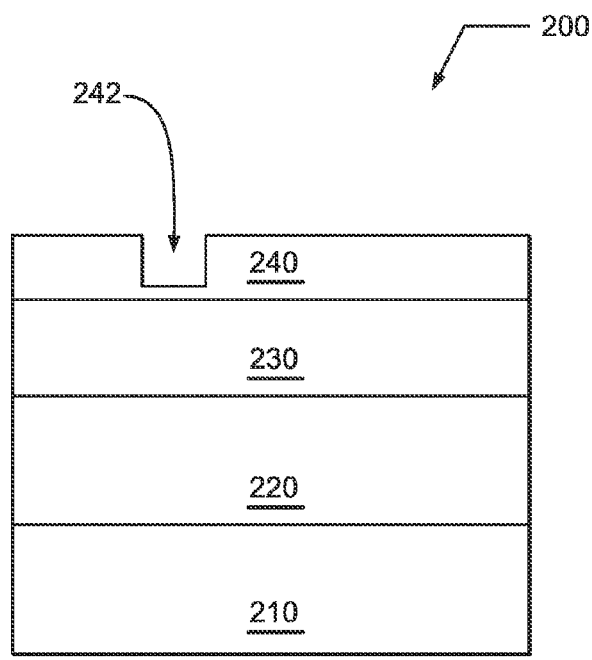
Figure 2E:
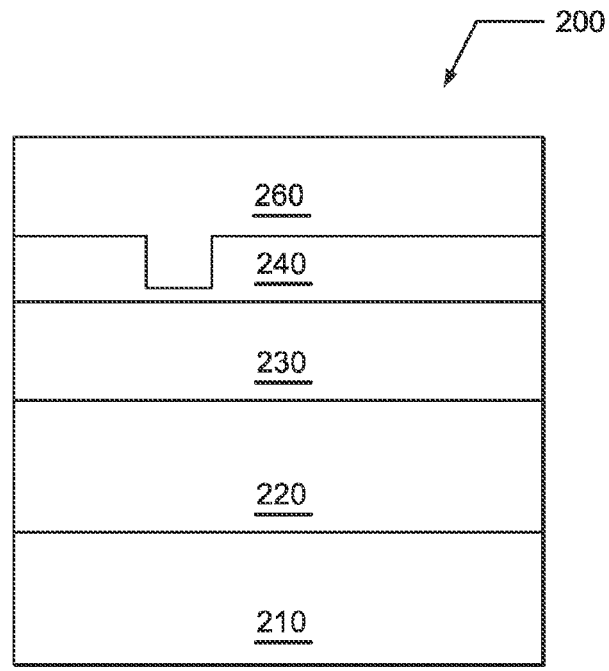

In 560 and as shown in FIG. 2D, the layer of photo-resist 250 is removed. For example, the photo-resist layer 250 may be removed using a wet stripping process, a dry plasma ashing process, or a dry non-plasma ashing process. Thereafter, as shown in FIG. 2E, an optional second photo-resist layer 260 is formed on the developable ARC layer 240.

The optional second photo-resist layer 260 may comprise 248 nm (nanometer) resists, 193 nm resists, 157 nm resists, or EUV (extreme ultraviolet) resists. The optional second photo-resist layer 260 can be formed using a track system. For example, the track system can comprise a Clean Track ACT 8, ACT 12, or Lithius resist coating and developing system commercially available from Tokyo Electron Limited (TEL). Other systems and methods for forming a photo-resist film on a substrate are well known to those skilled in the art of spin-on resist technology.

Figure 2F:
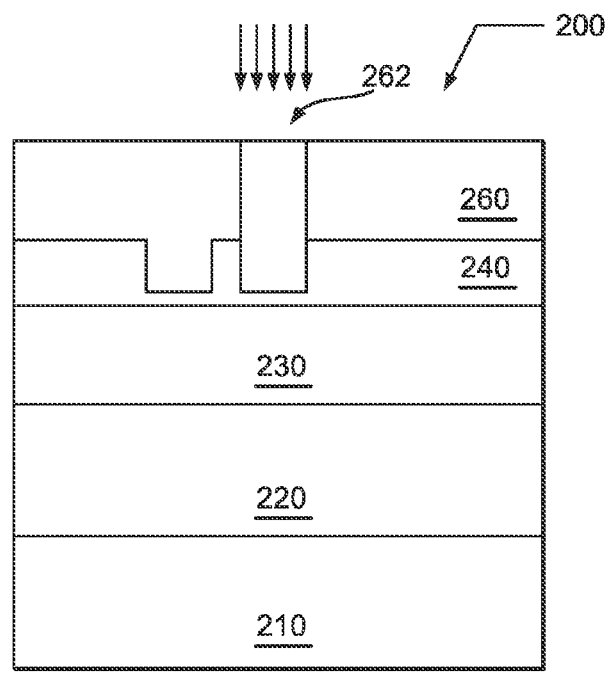
Figure 2G:
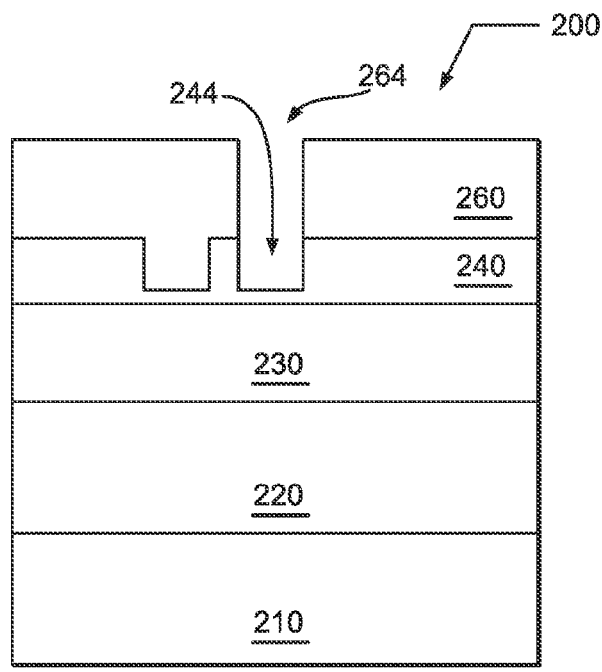
Figure 2H:
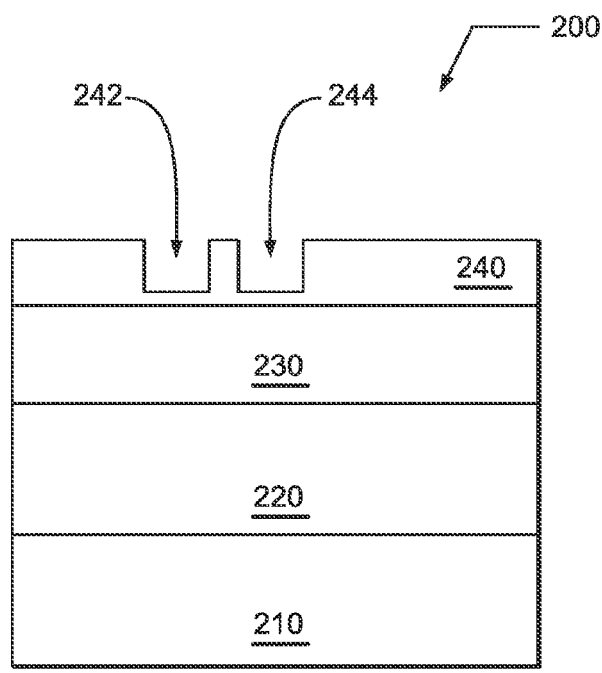

As shown in FIGS. 2F and 2G, respectively, the optional second photo-resist layer 260 is imaged with an optional second image pattern 262, and the exposed optional second photo-resist layer 260 is subjected to a developing process to remove the optional second image pattern region and form an optional second mask pattern 264 in the optional second photo-resist layer 260. Additionally, as shown in FIGS. 2F and 2G, respectively, the developable ARC layer 240 is partially imaged with the optional second image pattern 262, and the exposed developable ARC layer 240 is subjected to a developing process to remove the optional second image pattern region and form an optional second mask pattern 244 in the developable ARC layer 240. As shown in FIG. 2H, the optional second layer of photo-resist 260 is removed.

Other techniques may be utilized to double pattern, or multi-pattern, the developable ARC layer 240 using a single layer of photo-resist. For example, the single layer of photo-resist may be double imaged as described in co-pending U.S. patent application Ser. No. 11/534,261, entitled "METHOD AND SYSTEM FOR DOUBLE IMAGING A DEVELOPABLE ANTI-REFLECTIVE COATING", filed on even date herewith, and then removed following the partial transfer of the double pattern to the underlying developable ARC layer. Alternatively, for example, the single layer of photo-resist may be imaged and developed, and these two steps may be repeated with the same layer of photo-resist as described in co-pending U.S. patent application Ser. No. 11/534,365, entitled "METHOD AND SYSTEM FOR DOUBLE PATTERNING A DEVELOPABLE ANTI-REFLECTIVE COATING", filed on even date herewith. The entire contents of these applications are herein incorporated by reference in their entirety.

Figure 2I:
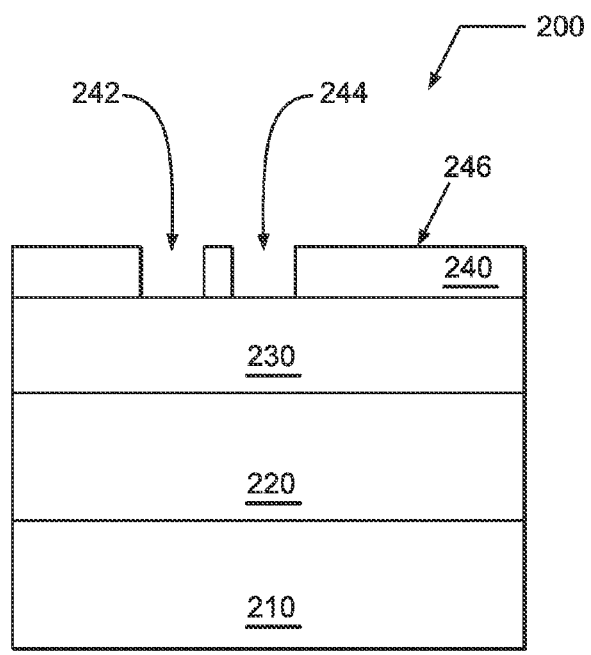

In 570 and as shown in FIG. 2I, the transfer of the first ARC pattern 242 and the optional second ARC pattern 244 to developable ARC layer 240 is completed, while thinning the developable ARC layer 240. For example, the first ARC pattern 242 and the optional second ARC pattern 244 may be substantially transferred through the thickness of the developable ARC layer 240 using an etching process, such as a dry etching process or a wet etching process. Alternatively, for example, the etching process may comprise a dry plasma etching process or a dry non-plasma etching process. During the transfer of the first ARC pattern 242 and the optional second ARC pattern 244 substantially through the developable ARC layer 240, the flat-field 246 is etched and the thickness of the developable ARC layer 240 is reduced.

Figure 2J:
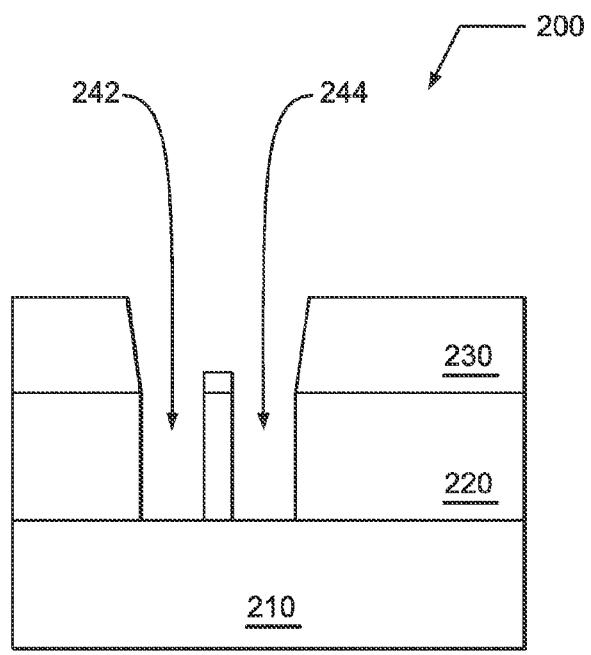
Figure 3:
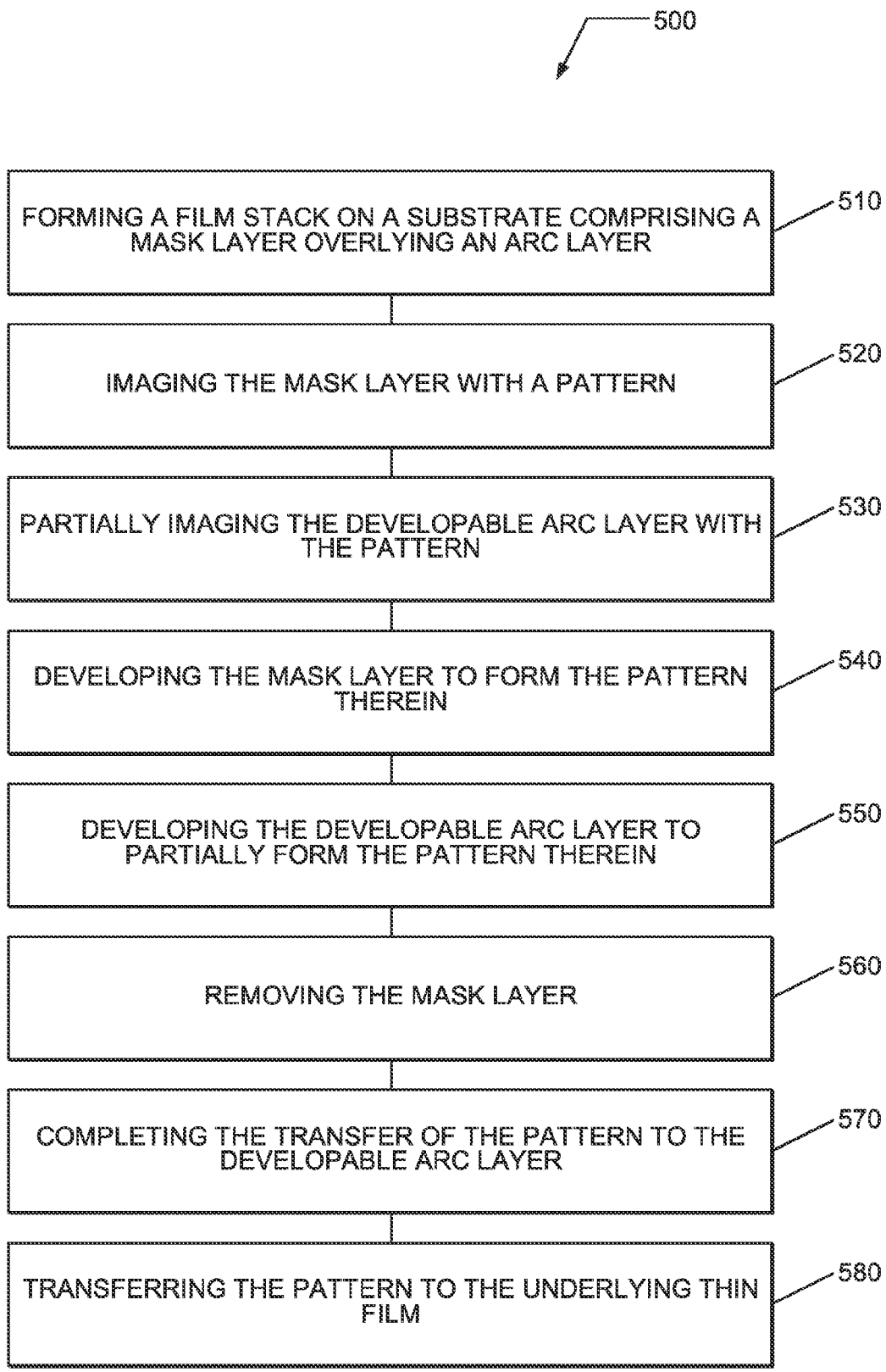
FIG. 3 illustrates a flow chart of a method for patterning a thin film on a substrate according to an embodiment of the invention.

In 580 and as shown in FIG. 2J, the first ARC pattern 242 and the optional second ARC pattern 244 are transferred to the underlying OPL 230, if present, and to the thin film 220 to form a feature pattern 222 and an optional second feature pattern 224 using one or more etching processes. During the one or more etching processes, the developable ARC layer 240 is substantially consumed as illustrated in FIG. 2J. The one or more etching processes may include any combination of wet or dry etching processes. The dry etching processes may include dry plasma etching processes or dry non-plasma etching processes. Thereafter, the OPL 230, if present, may be removed.

Although only certain embodiments of this invention have been described in detail above, those skilled in the art will readily appreciate that many modifications are possible in the embodiments without materially departing from the novel teachings and advantages of this invention. For example, several embodiments illustrate the use of positive tone developable resists and developable ARC layers; however, other embodiments are contemplated that utilize negative tone developable resists and developable ARC layers. Accordingly, all such modifications are intended to be included within the scope of this invention.

What is claimed is:

1. A method of patterning a thin film on a substrate, comprising:
   preparing a film stack on said substrate, said film stack comprising said thin film formed on said substrate, a developable anti-reflective coating (ARC) layer formed on said thin film, and a layer of photo-resist formed on said developable ARC layer;
   imaging said layer of photo-resist with a pattern using a photo-lithography system;
   partially imaging said developable ARC layer with said pattern such that said imaging is to a depth less than the thickness of said ARC layer using said photo-lithography system;
   developing said layer of photo-resist to form said pattern in said layer of photo-resist;
   developing said developable ARC layer to partially form said pattern extending to said depth wherein a remaining thickness of said developable ARC remains non-developed;
   removing said layer of photo-resist following said developing of said layer of photo-resist and said developing of said developable ARC layer;
   transferring said pattern in said developable ARC layer substantially through said remaining thickness of said developable ARC layer by etching said developable ARC layer; and
   transferring said pattern to said thin film while substantially consuming said developable ARC layer.

2. The method of claim 1, wherein said partially imaging said pattern in said developable ARC layer comprises setting at least one of an exposure dose, or an exposure depth of focus, or both in said photo-lithography system to achieve said depth.

3. The method of claim 1, wherein said etching comprises performing a wet etching process, or a dry etching process, or a combination thereof.

4. The method of claim 1, wherein said forming said layer of photo-resist comprises forming a 248 nm resist, a 193 nm resist, a 157 nm resist, or an EUV resist, or a combination of two or more thereof on said developable ARC layer.

5. The method of claim 1, wherein said preparing said film stack further comprises forming an organic planarization layer (OPL) on said thin film and forming said developable ARC layer on said OPL.

6. The method of claim 5, wherein said forming said OPL comprises forming a polyacrylate resin, an epoxy resin, a phenol resin, a polyamide resin, a polyimide resin, an unsaturated polyester resin, a polyphenylenether resin, a polyphenylenesulfide resin, or benzocyclobutene (BCB), or a combination of two or more thereof.

7. The method of claim 5, wherein said forming said OPL comprises forming a photo-sensitive OPL, or an etch type OPL, or both.

8. The method of claim 5, further comprising:
   transferring said pattern in said developable ARC layer to said OPL prior to said transferring said pattern to said thin film.

9. The method of claim 8, wherein said transferring said pattern in said developable ARC layer to said OPL comprises etching said pattern into said OPL.

10. The method of claim 5, further comprising:
    removing said OPL following said transferring said pattern to said thin film.

11. The method of claim 8, wherein said transferring said pattern in said developable ARC layer to said OPL substantially consumes said developable ARC layer.

12. The method of claim 1, wherein said imaging said pattern in said layer of photo-resist comprises imaging said pattern using a dry photo-lithography system, or a wet lithography system, or both.

13. The method of claim 1, wherein said imaging said pattern in said layer of photo-resist comprises imaging said pattern using a 248 nm photo-lithography system, a 193 nm photo-lithography system, a 157 nm photo-lithography system, or an EUV photo-lithography system, or a combination of two or more thereof.

14. The method of claim 1, wherein said partially imaging said pattern in said developable ARC layer comprises imaging said pattern using a dry photo-lithography system, or a wet lithography system, or both.

15. The method of claim 1, wherein said partially imaging said pattern in said developable ARC layer comprises imaging said pattern using a 248 nm photo-lithography system, a 193 nm photo-lithography system, a 157 nm photo-lithography system, or an EUV photo-lithography system, or a combination of two or more thereof.

16. The method of claim 1, wherein said forming said developable ARC layer comprises forming a developable ARC layer configured for 248 nm photo-lithography, 193 nm photo-lithography, 157 nm photo-lithography, or EUV photo-lithography.

* * * * *